United States Patent
Higgins et al.

(10) Patent No.: US 9,152,555 B2
(45) Date of Patent: Oct. 6, 2015

(54) DATA MANAGEMENT WITH MODULAR ERASE IN A DATA STORAGE SYSTEM

(71) Applicant: SanDisk Enterprise IP LLC, Dallas, TX (US)

(72) Inventors: James M. Higgins, Chandler, AZ (US); Robert W. Ellis, Phoenix, AZ (US); Mark Dancho, Chandler, AZ (US); James Fitzpatrick, Sudbury, MA (US)

(73) Assignee: SANDISK ENTERPRISE IP LLC., Milpitas, CA (US)

( * ) Notice: Subject to any disclaimer, the term of this patent is extended or adjusted under 35 U.S.C. 154(b) by 123 days.

(21) Appl. No.: 14/082,031

(22) Filed: Nov. 15, 2013

(65) Prior Publication Data

US 2015/0143068 A1    May 21, 2015

(51) Int. Cl.
| | |
|---|---|
| G06F 12/00 | (2006.01) |
| G06F 12/02 | (2006.01) |
| G11C 16/14 | (2006.01) |
| G11C 16/16 | (2006.01) |

(52) U.S. Cl.
CPC ........ G06F 12/0246 (2013.01); G06F 12/0238 (2013.01); G11C 16/14 (2013.01); G11C 16/16 (2013.01); G06F 2212/1044 (2013.01); G06F 2212/7205 (2013.01)

(58) Field of Classification Search
CPC ............ G06F 12/0238; G06F 12/0246; G06F 2212/7205
See application file for complete search history.

(56) References Cited

U.S. PATENT DOCUMENTS

| | | | |
|---|---|---|---|
| 4,048,481 | A | 9/1977 | Bailey, Jr. et al. |
| 4,839,587 | A | 6/1989 | Flatley et al. |
| 4,916,652 | A | 4/1990 | Schwarz et al. |
| 5,034,744 | A | 7/1991 | Obinata |
| 5,210,854 | A | 5/1993 | Beaverton et al. |
| 5,311,395 | A | 5/1994 | McGaha et al. |
| 5,450,354 | A | 9/1995 | Sawada et al. |

(Continued)

FOREIGN PATENT DOCUMENTS

| | | |
|---|---|---|
| EP | 1465203 A1 | 10/2004 |
| EP | 1 956 489 A2 | 8/2008 |

(Continued)

OTHER PUBLICATIONS

Cooke, "Introduction to Flash Memory (T1A)," Flash Memory Summit, Aug. 22, 2008, Micron Technology, Inc., 102 pages.

(Continued)

*Primary Examiner* — Shawn X Gu
(74) *Attorney, Agent, or Firm* — Morgan, Lewis & Bockius LLP

(57) ABSTRACT

A system and method of data management with modular erase in a data storage system with a memory array having an erase block and a target block with the target block in a logical unit separate from the erase block including: performing an erase operation on the erase block, the erase operation having an operation matrix configured for partial erasing of the erase block; updating a command status for the erase block; enabling an intervening command on the target block based on the command status indicating an incomplete erase status with the intervening command updating the command status; performing an erase optimization based on the command status; performing an additional erase operation based on the erase optimization; and updating the command status to an erase complete status based on the additional erase operation.

20 Claims, 7 Drawing Sheets

(56) References Cited

U.S. PATENT DOCUMENTS

| | | |
|---|---|---|
| 5,479,638 A | 12/1995 | Assar et al. |
| 5,519,847 A | 5/1996 | Fandrich et al. |
| 5,530,705 A | 6/1996 | Malone |
| 5,537,555 A | 7/1996 | Landry |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,784,174 A | 7/1998 | Fujino et al. |
| 5,790,828 A | 8/1998 | Jost |
| 5,805,501 A | 9/1998 | Shiau et al. |
| 5,930,504 A | 7/1999 | Gabel |
| 5,943,692 A | 8/1999 | Marberg et al. |
| 5,949,785 A | 9/1999 | Beasley |
| 5,963,983 A | 10/1999 | Sakakura et al. |
| 5,982,664 A | 11/1999 | Watanabe |
| 6,000,006 A | 12/1999 | Bruce et al. |
| 6,016,560 A | 1/2000 | Wada et al. |
| 6,018,304 A | 1/2000 | Bessios |
| 6,034,897 A | 3/2000 | Estakhri et al. |
| 6,069,827 A | 5/2000 | Sinclair |
| 6,070,074 A | 5/2000 | Perahia et al. |
| 6,091,652 A | 7/2000 | Haehn et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,195,290 B1 | 2/2001 | Dallabora et al. |
| 6,275,436 B1 | 8/2001 | Tobita et al. |
| 6,295,592 B1 | 9/2001 | Jeddeloh et al. |
| 6,311,263 B1 | 10/2001 | Barlow et al. |
| 6,345,367 B1 | 2/2002 | Sinclair |
| 6,356,447 B2 | 3/2002 | Scafidi |
| 6,381,670 B1 | 4/2002 | Lee et al. |
| 6,412,080 B1 | 6/2002 | Fleming et al. |
| 6,442,076 B1 | 8/2002 | Roohparvar |
| 6,449,625 B1 | 9/2002 | Wang |
| 6,484,224 B1 | 11/2002 | Robins et al. |
| 6,515,909 B1 | 2/2003 | Wooldridge |
| 6,516,437 B1 | 2/2003 | Van Stralen et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,665,214 B1 | 12/2003 | Cheah et al. |
| 6,678,788 B1 | 1/2004 | O'Connell |
| 6,728,913 B1 | 4/2004 | Parker |
| 6,757,768 B1 | 6/2004 | Potter et al. |
| 6,763,424 B2 | 7/2004 | Conley |
| 6,775,792 B2 | 8/2004 | Ulrich et al. |
| 6,778,387 B2 | 8/2004 | Fairchild |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,850,443 B2 | 2/2005 | Lofgren et al. |
| 6,854,070 B2 | 2/2005 | Johnson et al. |
| 6,871,257 B2 | 3/2005 | Conley et al. |
| 6,871,304 B2 | 3/2005 | Hadjihassan et al. |
| 6,895,464 B2 | 5/2005 | Chow et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,082,495 B2 | 7/2006 | DeWhitt et al. |
| 7,100,002 B2 | 8/2006 | Shrader et al. |
| 7,107,389 B2 | 9/2006 | Inagaki et al. |
| 7,111,293 B1 | 9/2006 | Hersh et al. |
| 7,139,864 B2 | 11/2006 | Bennett et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,233,497 B2 | 6/2007 | Simon et al. |
| 7,243,186 B2 | 7/2007 | Liang et al. |
| 7,298,888 B2 | 11/2007 | Hamar |
| 7,328,377 B1 | 2/2008 | Lewis et al. |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,681,106 B2 | 3/2010 | Jarrar et al. |
| 7,685,494 B1 | 3/2010 | Varnica et al. |
| 7,693,422 B2 | 4/2010 | Alicherry et al. |
| 7,707,481 B2 | 4/2010 | Kirschner et al. |
| 7,738,502 B2 | 6/2010 | Chang et al. |
| 7,743,216 B2 | 6/2010 | Lubbers et al. |
| 7,761,655 B2 | 7/2010 | Mizushima et al. |
| 7,774,390 B2 | 8/2010 | Shin |
| 7,818,525 B1 | 10/2010 | Frost et al. |
| 7,827,348 B2 | 11/2010 | Lee et al. |
| 7,830,164 B2 | 11/2010 | Earle et al. |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich |
| 7,979,614 B1 | 7/2011 | Yang |
| 7,996,642 B1 | 8/2011 | Smith |
| 8,000,135 B1 | 8/2011 | Perlmutter et al. |
| 8,006,161 B2 | 8/2011 | Lestable et al. |
| 8,010,738 B1 | 8/2011 | Chilton et al. |
| 8,028,123 B2 | 9/2011 | Kilzer et al. |
| 8,032,724 B1 | 10/2011 | Smith |
| 8,036,044 B2 | 10/2011 | Dong et al. |
| 8,046,645 B2 | 10/2011 | Hsu et al. |
| 8,051,241 B2 | 11/2011 | Feldman et al. |
| 8,069,390 B2 | 11/2011 | Lin |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,190,967 B2 | 5/2012 | Hong et al. |
| 8,205,028 B1 | 6/2012 | Sakarda |
| 8,209,677 B2 | 6/2012 | Shintani et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,250,621 B2 | 8/2012 | Cha |
| 8,254,172 B1 | 8/2012 | Kan |
| 8,254,181 B2 | 8/2012 | Hwang et al. |
| 8,259,506 B1 | 9/2012 | Sommer et al. |
| 8,289,801 B2 | 10/2012 | Smith et al. |

(56) References Cited

U.S. PATENT DOCUMENTS

| | | |
|---|---|---|
| 8,296,534 B1 | 10/2012 | Gupta et al. |
| 8,312,349 B2 | 11/2012 | Reche et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,386,700 B2 | 2/2013 | Olbrich et al. |
| 8,386,860 B2 | 2/2013 | Tseng et al. |
| 8,391,068 B2 | 3/2013 | Shelton et al. |
| 8,407,409 B2 | 3/2013 | Kawaguchi |
| 8,412,985 B1 | 4/2013 | Bowers et al. |
| 8,464,106 B2 | 6/2013 | Filor et al. |
| 8,503,238 B1 | 8/2013 | Wu et al. |
| 8,601,203 B2 | 12/2013 | Holbrook et al. |
| 8,612,669 B1 | 12/2013 | Syu et al. |
| 8,612,804 B1 | 12/2013 | Kang et al. |
| 8,661,184 B2 | 2/2014 | Wood et al. |
| 8,694,811 B2 | 4/2014 | Raju et al. |
| 8,832,506 B2 | 9/2014 | Griffin et al. |
| 8,984,216 B2 | 3/2015 | Fillingim |
| 2002/0024846 A1 | 2/2002 | Kawahara et al. |
| 2002/0056025 A1 | 5/2002 | Qiu et al. |
| 2002/0083299 A1 | 6/2002 | Van Huben et al. |
| 2002/0152305 A1 | 10/2002 | Jackson et al. |
| 2002/0156891 A1 | 10/2002 | Ulrich et al. |
| 2002/0159285 A1 | 10/2002 | Morley et al. |
| 2002/0162075 A1 | 10/2002 | Talagala et al. |
| 2002/0165896 A1 | 11/2002 | Kim |
| 2003/0033308 A1 | 2/2003 | Patel et al. |
| 2003/0041299 A1 | 2/2003 | Kanazawa et al. |
| 2003/0043829 A1 | 3/2003 | Rashid et al. |
| 2003/0046603 A1 | 3/2003 | Harari et al. |
| 2003/0074592 A1 | 4/2003 | Hasegawa |
| 2003/0088805 A1 | 5/2003 | Majni et al. |
| 2003/0093628 A1 | 5/2003 | Matter et al. |
| 2003/0163633 A1 | 8/2003 | Aasheim et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0080985 A1 | 4/2004 | Chang et al. |
| 2004/0088511 A1 | 5/2004 | Bacon et al. |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0076102 A1 | 4/2005 | Chen et al. |
| 2005/0114587 A1 | 5/2005 | Chou et al. |
| 2005/0144516 A1 | 6/2005 | Gonzalez et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0015683 A1 | 1/2006 | Ashmore et al. |
| 2006/0020745 A1 | 1/2006 | Conley et al. |
| 2006/0022054 A1 | 2/2006 | Elhamias et al. |
| 2006/0039196 A1 | 2/2006 | Gorobets et al. |
| 2006/0053246 A1 | 3/2006 | Lee |
| 2006/0080505 A1 | 4/2006 | Arai et al. |
| 2006/0085671 A1 | 4/2006 | Majni et al. |
| 2006/0136570 A1 | 6/2006 | Pandya |
| 2006/0136682 A1 | 6/2006 | Haridas et al. |
| 2006/0143365 A1 | 6/2006 | Kikuchi |
| 2006/0143475 A1 | 6/2006 | Herbert et al. |
| 2006/0156177 A1 | 7/2006 | Kottapalli et al. |
| 2006/0195650 A1 | 8/2006 | Su et al. |
| 2006/0253641 A1 | 11/2006 | Gatzemeier et al. |
| 2006/0256624 A1 | 11/2006 | Eggleston et al. |
| 2006/0259528 A1 | 11/2006 | Dussud et al. |
| 2006/0282644 A1 | 12/2006 | Wong |
| 2006/0294574 A1 | 12/2006 | Cha |
| 2007/0011413 A1 | 1/2007 | Nonaka et al. |
| 2007/0050536 A1 | 3/2007 | Kolokowsky |
| 2007/0058446 A1 | 3/2007 | Hwang et al. |
| 2007/0061511 A1 | 3/2007 | Faber |
| 2007/0061597 A1 | 3/2007 | Holtzman et al. |
| 2007/0067598 A1 | 3/2007 | Fujimoto |
| 2007/0076479 A1 | 4/2007 | Kim et al. |
| 2007/0079152 A1 | 4/2007 | Winick et al. |
| 2007/0081408 A1 | 4/2007 | Kwon et al. |
| 2007/0083697 A1 | 4/2007 | Birrell et al. |
| 2007/0083779 A1 | 4/2007 | Misaka et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujbayashi et al. |
| 2007/0208901 A1 | 9/2007 | Purcell et al. |
| 2007/0226592 A1 | 9/2007 | Radke |
| 2007/0234004 A1 | 10/2007 | Oshima et al. |
| 2007/0234143 A1 | 10/2007 | Kim |
| 2007/0245061 A1 | 10/2007 | Harriman |
| 2007/0260811 A1 | 11/2007 | Merry et al. |
| 2007/0263444 A1 | 11/2007 | Gorobets et al. |
| 2007/0276973 A1 | 11/2007 | Tan et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0082736 A1 | 4/2008 | Chow et al. |
| 2008/0086677 A1 | 4/2008 | Yang et al. |
| 2008/0126720 A1 | 5/2008 | Danilak |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0183918 A1 | 7/2008 | Dhokia et al. |
| 2008/0189588 A1 | 8/2008 | Tanaka et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0263289 A1 | 10/2008 | Hosoya et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313505 A1 | 12/2008 | Lee et al. |
| 2009/0003058 A1 | 1/2009 | Kang |
| 2009/0006900 A1 | 1/2009 | Lastras-Montano et al. |
| 2009/0019321 A1 | 1/2009 | Radke |
| 2009/0037652 A1 | 2/2009 | Yu et al. |
| 2009/0070651 A1 | 3/2009 | Diggs et al. |
| 2009/0083587 A1 | 3/2009 | Ng et al. |
| 2009/0089485 A1 | 4/2009 | Yeh |
| 2009/0091990 A1 | 4/2009 | Park et al. |
| 2009/0109786 A1 | 4/2009 | Ye et al. |
| 2009/0125670 A1 | 5/2009 | Keays |
| 2009/0138654 A1 | 5/2009 | Sutardja |
| 2009/0144598 A1 | 6/2009 | Yoon et al. |
| 2009/0146721 A1 | 6/2009 | Kurooka et al. |

(56) References Cited

U.S. PATENT DOCUMENTS

| | | |
|---|---|---|
| 2009/0157948 A1 | 6/2009 | Trichina et al. |
| 2009/0164702 A1 | 6/2009 | Kern |
| 2009/0164710 A1 | 6/2009 | Choi et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0179707 A1 | 7/2009 | Higashino |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228634 A1 | 9/2009 | Nakamura et al. |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0296466 A1 | 12/2009 | Kim et al. |
| 2009/0296486 A1 | 12/2009 | Kim et al. |
| 2009/0300238 A1 | 12/2009 | Panabaker et al. |
| 2009/0319864 A1 | 12/2009 | Shrader |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0061151 A1 | 3/2010 | Miwa et al. |
| 2010/0103737 A1 | 4/2010 | Park |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0161936 A1 | 6/2010 | Royer et al. |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0332726 A1 | 12/2010 | Wang |
| 2011/0002224 A1 | 1/2011 | Tamura |
| 2011/0016239 A1 | 1/2011 | Stenfort |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0083060 A1 | 4/2011 | Sakurada et al. |
| 2011/0099342 A1 | 4/2011 | Ozdemir |
| 2011/0107144 A1* | 5/2011 | Ohara .............................. 714/16 |
| 2011/0113281 A1 | 5/2011 | Zhang et al. |
| 2011/0131365 A1 | 6/2011 | Zhang et al. |
| 2011/0131444 A1 | 6/2011 | Buch et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1 | 6/2011 | Weingarten |
| 2011/0173378 A1 | 7/2011 | Filor et al. |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0205823 A1 | 8/2011 | Hemink et al. |
| 2011/0209032 A1 | 8/2011 | Choi et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1 | 3/2012 | Naeimi |
| 2012/0096217 A1 | 4/2012 | Son et al. |
| 2012/0110250 A1 | 5/2012 | Sabbag et al. |
| 2012/0124046 A1 | 5/2012 | Provenzano |
| 2012/0124273 A1 | 5/2012 | Goss et al. |
| 2012/0151253 A1 | 6/2012 | Horn |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0195126 A1 | 8/2012 | Roohparvar |
| 2012/0213004 A1 | 8/2012 | Yun et al. |
| 2012/0216085 A1 | 8/2012 | Weingarten et al. |
| 2012/0233384 A1 | 9/2012 | Charles et al. |
| 2012/0236656 A1 | 9/2012 | Cometti |
| 2012/0239858 A1 | 9/2012 | Melik-Martirosian |
| 2012/0239976 A1 | 9/2012 | Cometti et al. |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0317334 A1 | 12/2012 | Suzuki et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0073788 A1 | 3/2013 | Post et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0238833 A1 | 9/2013 | Vogan et al. |
| 2013/0265825 A1 | 10/2013 | Lassa |
| 2013/0332791 A1 | 12/2013 | Chu |
| 2014/0036589 A1 | 2/2014 | Parthasarathy et al. |
| 2014/0059359 A1 | 2/2014 | Bahirat |
| 2014/0108891 A1 | 4/2014 | Strasser et al. |
| 2014/0129874 A1 | 5/2014 | Zaltsman et al. |
| 2014/0158525 A1 | 6/2014 | Greene |
| 2014/0208174 A1 | 7/2014 | Ellis et al. |
| 2014/0372777 A1 | 12/2014 | Reller et al. |

FOREIGN PATENT DOCUMENTS

| | | |
|---|---|---|
| EP | 1 990 921 A2 | 11/2008 |
| EP | 2 498 259 A2 | 9/2012 |
| JP | 2002-532806 | 10/2002 |
| JP | 2012129659 A | 7/2012 |
| WO | WO 2007/036834 | 4/2007 |
| WO | WO 2007/080586 | 7/2007 |

(56) References Cited

FOREIGN PATENT DOCUMENTS

| WO | WO 2008/121553 | 10/2008 |
|---|---|---|
| WO | WO 2008/121577 | 10/2008 |
| WO | WO 2009/028281 | 3/2009 |
| WO | WO 2009/032945 | 3/2009 |
| WO | WO 2009/042298 A1 | 4/2009 |
| WO | WO 2009/058140 | 5/2009 |
| WO | WO 2009/084724 | 7/2009 |
| WO | WO 2009/134576 | 11/2009 |
| WO | WO 2011/156466 A2 | 12/2011 |

OTHER PUBLICATIONS

Gal et al., "Algotithms and Data Structures for Flash Memories," ACM Computing Surveys, Jun. 2005, vol. 37, No. 2, 30 pages.
IBM Corporation, "Systems Management, Work Management," Version 5, Release 4, 9th Edition, Feb. 2006, pp. 1-21.
O'Brien, "SMART Storage Systems Optimus SAS Enterprise SSD Review," SMART Storage Systems, Oct. 9, 2012, 44 pages.
Spanjer, "Flash Management—Why and How?" Smart Modular Technologies, Nov. 2009, http://www.scantec.de/fileadmin/pdf/Smart_Modular/Flash-Management.pdf, 14 pages.
Texas Instruments, "Power Management IC for Digital Set Top Boxes," SLVSA10A, Sep. 2009, pp. 1-22.
International Search Report and Written Opinion dated Dec. 20, 2013, received in PCT/US2013/045282, which corresponds to U.S. Appl. No. 13/493,949, 7 pages (Ellis).
International Search Report and Written Opinion dated Jun. 12, 2014, received in PCT/US2014/018972, which corresponds to U.S. Appl. No. 13/779,352, 12 pages (Schmier).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
Ulinktech, "ATA Command Table (in Alphabetic Order)," Feb. 6, 2011, https://web.archive.org/web/20110206060820/http://www.ulinktech.com/downloads/AT, 6 pages.
International Search Report and Written Opinion dated Aug. 22, 2014, received in International Patent Application No. PCT/US2014/032978, which corresponds to U.S. Appl. No. 14/081,992, 10 pages (Ellis).
International Search Report dated Mar. 25, 2014, received in International Patent Application No. PCT/US2013/072400, which corresponds to U.S. Appl. No. 13/690,337, 3 pages (Ellis).
Invitation to Pay Additional Fees dated Jul. 25, 2014, received in International Patent Application No. PCT/US2014/021290, which corresponds to U.S. Appl. No. 13/791,797, 8 pages (Dean).
International Search Report and Written Opinion dated Jul. 31, 2014, received in International Patent Application No. PCT/US2014/031465, which corresponds to U.S. Appl. No. 13/851,928, 13 pages (Ellis).
International Search Report and Written Opinion dated Jul. 31, 2014, received in International Patent Application No. PCT/US2014/033876, which corresponds to U.S. Appl. No. 13/861,326, 9 pages (Fitzpatrick).
Gal et al., "Algorithms and Data Structures for Flash Memories", "ACM Computing Surveys", Jun. 2005, pp. 138-163, vol. 37, No. 2, ACM Inc., NY, US.
Cooke, "Introduction to Flash Memory (T1A)", "Flash Memory Summit", Aug. 22, 2008, pp. 1-102, Micron Technology, Inc., Santa Clara, US.
Spanjer, "Flash Management—Why and How?", "Smart Modular Technologies", Nov. 2009, pp. 1-14, http://www.scantec.de/fileadmin/pdf/Smart_Modular/Flash-Management.pdf.
International Search Report and Written Opinion dated Nov. 7, 2014, received in International Patent Application No. PCT/US2014/049732, which corresponds to U.S. Appl. No. 14/334,350, 13 pages (Fitzpatrick).
International Search Report and Written Opinion dated Oct. 17, 2014, received in International Patent Application No. PCT/US2014/049734, which corresponds to U.S. Appl. No. 14/332,259, 8 pages (Higgins).
International Search Report and Written Opinion dated Oct. 23, 2014, received in International Patent Application No. PCT/US2014/049736, which corresponds to U.S. Appl. No. 14/446,249, 8 pages (Fitzpatrick).
International Search Report and Written Opinion dated Nov. 5, 2014, received in International Patent Application No. PCT/US2014/049282, which corresponds to U.S. Appl. No. 13/957,407, 12 pages (Fitzpatrick).
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, Sep. 9, 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.

(56) References Cited

OTHER PUBLICATIONS

SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated Jan. 9, 2015, received in International Patent Application No. PCT/US2014/049731, which corresponds to U.S. Appl. No. 14/334,324, 9 pages (Fitzpatrick).
Narayanan et al., "Migrating Server Storage to SSDs: Analysis of Tradeoffs," Computer Systems, Apr. 2009, 12 pages.
Shiraz et al., "Block Aging Prevention Technique (BAP) for Flash Based Solid State Disks," 7th International Conference on Emerging Technologies (ICET), Sep. 5, 2011, 6 pages.
Tai et al, "Prolongation of Lifetime and the Evaluation Method of Dependable SSD," 25 International Symposium on Defect and Fault Tolerance in VLSI Systems, 2010, NJ, USA, 8 pages.
Tseng et al., "Understanding the Impact of Power Loss on Flash Memory," DAC'11, Jun. 5-10, 2011, San Diego, California, 6 pages.
Yimo et al., "WeLe-RAID: A SSD-Based RAID for System Endurance and Performance," Jan. 2011, Network and Parallel Computing, Springer, 14 pages.
International Search Report and Written Opinion dated Feb. 18, 2015, received in International Patent Application No. PCT/US2014/065401, which corresponds to U.S. Appl. No. 14/082,031, 9 pages. (Higgins).
International Search Report dated Apr. 15, 2014, received in International Patent Application No. PCT/US2013/078340, which corresponds to U.S. Appl. No. 13/746,542, 11 pages (Ellis).

\* cited by examiner

DATA MANAGEMENT WITH MODULAR ERASE IN A DATA STORAGE SYSTEM

TECHNICAL FIELD

The present invention relates generally to a data storage system and more particularly to data management with modular erase in a data storage system.

BACKGROUND ART

Various forms of long-term storage in computer systems include, other than electromechanical hard disks, non-volatile storage rooted in semiconductor or other memory technology. NOT-AND (NAND) flash memory is one form of non-volatile memory used in solid-state storage devices. In a common configuration of flash memory, the memory cells are arranged in typical row and column fashion with circuitry for accessing individual cells. The data store elements (e.g. transistors) of those cells are configured to hold two logical states in the case of Single Level Cell (SLC) or more than two logical states in the case of Multi Level Cell (MLC).

The flash memory is block-based storage and can require a block to be erased before being rewritten. Other commands cannot be performed while the erase operation is being performed. This can lead to longer command latency for the other commands while they wait for the erase operation to complete. In addition, because the duration of the erase operations can increase as the flash memory ages, the command latency can increase over time.

Thus, a need still remains for better data storage devices that can optimize command latency. In view of the ever-increasing commercial competitive pressures, along with growing consumer expectations and the diminishing opportunities for meaningful product differentiation in the marketplace, it is important to find answers for these problems. Additionally, the need to reduce costs, improve efficiencies and performance, and meet competitive pressures adds an even greater urgency to the critical necessity for finding answers to these problems.

Prior developments have long sought but not found optimal solutions to these problems. Hence, there remains a need that has long eluded those skilled in the art.

SUMMARY

The present disclosure covers a system and method of data management with modular erase in a data storage system including partitioning the erase operation into one or more partial erase operations, executing intervening commands between partial erase operations, modifying the operational values of the partial erase operations, and implementing a dwell time delay for partial erase.

Certain embodiments have other steps or elements in addition to or in place of those mentioned above. The steps or elements will become apparent to those skilled in the art from a reading of the following detailed description when taken with reference to the accompanying drawings. The embodiments described herein are illustrative and should not limit the scope of the claimed invention as recited in the claims.

DETAILED DESCRIPTION

Figure 1:
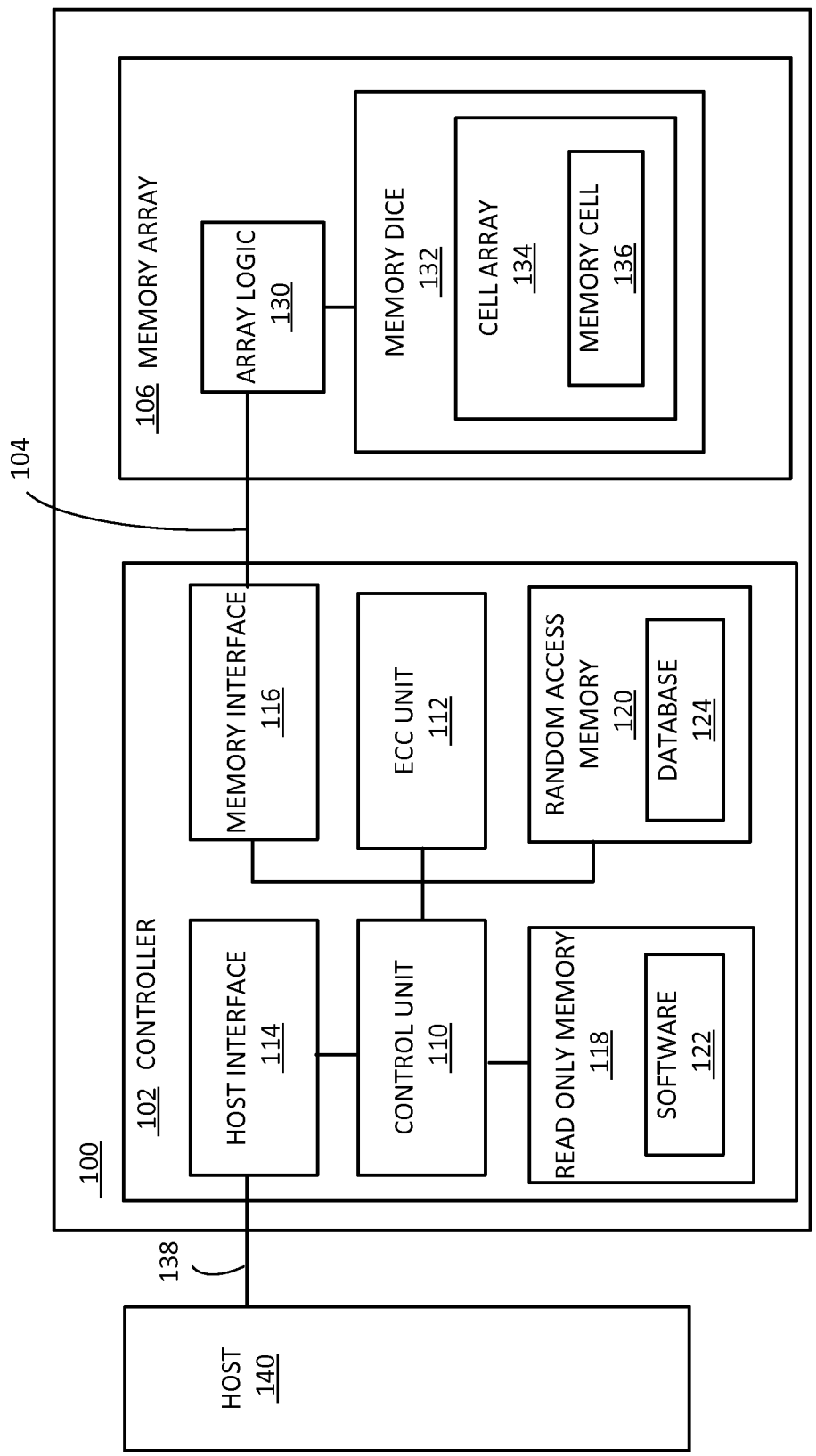
FIG. 1 is a block diagram of a data storage system in an embodiment of the present invention.

The following embodiments are described in sufficient detail to enable those skilled in the art to make and use the claimed invention. It is to be understood that other embodiments would be evident based on the present disclosure, and that system, process, or mechanical changes may be made without departing from the scope of the claimed invention.

In the following description, numerous specific details are given to provide a thorough understanding of the invention. However, it will be apparent that the invention may be practiced without these specific details. In order to simplify the disclosure, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing figures.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

Referring now to FIG. 1, therein is shown a block diagram of a data storage system 100 in an embodiment of the present invention. The data storage system 100 includes memory array 106 coupled to a controller 102 via a memory bus 104

The controller 102 is a processing unit for managing the storage and retrieval of data in the memory array 106. The controller 102 can be an embedded processor, control logic, or a combination thereof. The controller 102 can transfer stored data from the memory array 106 to a host device 140.

The memory array 106 is a non-volatile memory unit for storing data. The memory array 106 can include NAND flash memory arrays, NOR flash memory arrays, other non-volatile memory arrays, or a combination thereof.

The memory array 106 can be formed with memory dice 132. The memory dice 132 are semiconductor devices for storing information. The memory dice are the minimum unit that can independently execute commands and report status. For example, the memory dice 132 can be flash memory devices, NAND flash memory chips, NOR flash memory devices, or a combination thereof.

The memory bus 104 is a communication channel. The memory bus 104 conveys data and control information between the controller 102 and the memory array 106.

The memory dice 132 can include a cell array 134. The cell array 134 is a set of non-volatile flash memory cells for storing data. For example, the cell array 134 can include a single-level cell flash memory, a multi-level cell flash memory, a mixed functionality cell, or a combination thereof.

The cell array 134 can include memory cells 136. The memory cells 136 are electronic structures for storing information. For example, the memory cells 136 can be floating gate flash memory devices.

The memory array 106 can include an array logic unit 130 coupled to the cell array 134. The array logic unit 130 is circuitry to provide addressing, data transfer and sensing, and other support to control the memory array 106 for saving and retrieving information from the cell array 134.

The controller 102 can include a memory interface 116 coupled to the memory array 106. The memory interface 116 can include circuitry for communicating with the memory array 106 over the memory bus 104.

The controller 102 can include a control unit 110 coupled to the memory interface 116 and a host interface 114. A read only memory 118 can be coupled to the control unit 110. A random access memory 120 can be coupled to the control unit 110 and to the read only memory 118. The random access memory 120 can be utilized as a buffer memory for temporary storage of data being written to or read from the memory array 106.

The random access memory 120 can include a controller database 124. The controller database 124 is a data storage and retrieval system. The controller database 124 can be used to store read threshold information.

The read only memory 118 can include a software 122 for operating the control unit 110. The software 122 is executable code for implementing the intelligence of the data storage system 100.

The controller 102 can include an error correction code unit 112 coupled to the control unit 110. The error correction code unit 112 is a processing module for calculating an error correction code value that can be used to detect errors, correct errors, or a combination thereof in data stored or transmitted from the memory array 106.

The error correction code unit 112 can calculate one or more error correction code values using different methods such as a Reed-Solomon code, a Hamming code, a Bose-Chauduri-Hocquenghem (BCH) code, or a combination thereof. Although the error correction code unit 112 is a dedicated element for calculating error correction codes, it is understood that error correction codes can also be calculated in other ways, such as using the control unit 110 to calculate error correction codes.

The controller 102 can include the host interface 114 coupled to the host device 140 via a digital connection 138. The host device 140 is a computing device that can use the data storage system 100 for storing data. For example, the host device 140 can be a laptop computer, a desktop computer, a server, a smart phone, or a combination thereof.

The host interface 114 can communicate commands and data between the host device 140 and the controller 102 with the digital connection 138. For example, the host interface 114 can detect a connection to the host device 140 and generate command based on the connection to the host device 140.

The data storage system 100 can be connected to the host device 140 with the digital connection 138. The digital connection 138 is a communication link for transferring digital information between the data storage system 100 and the host device 140.

The digital connection 138 can be formed in a variety of ways. For example, the digital connection 138 can be a universal serial bus (USB) connection for transferring information. In another example, the digital connection 138 can be a wireless communication mechanism, such as Wireless Fidelity (Wi-Fi), infrared communication mechanism, optical communication system, near field communication system, or a combination thereof.

Figure 2:
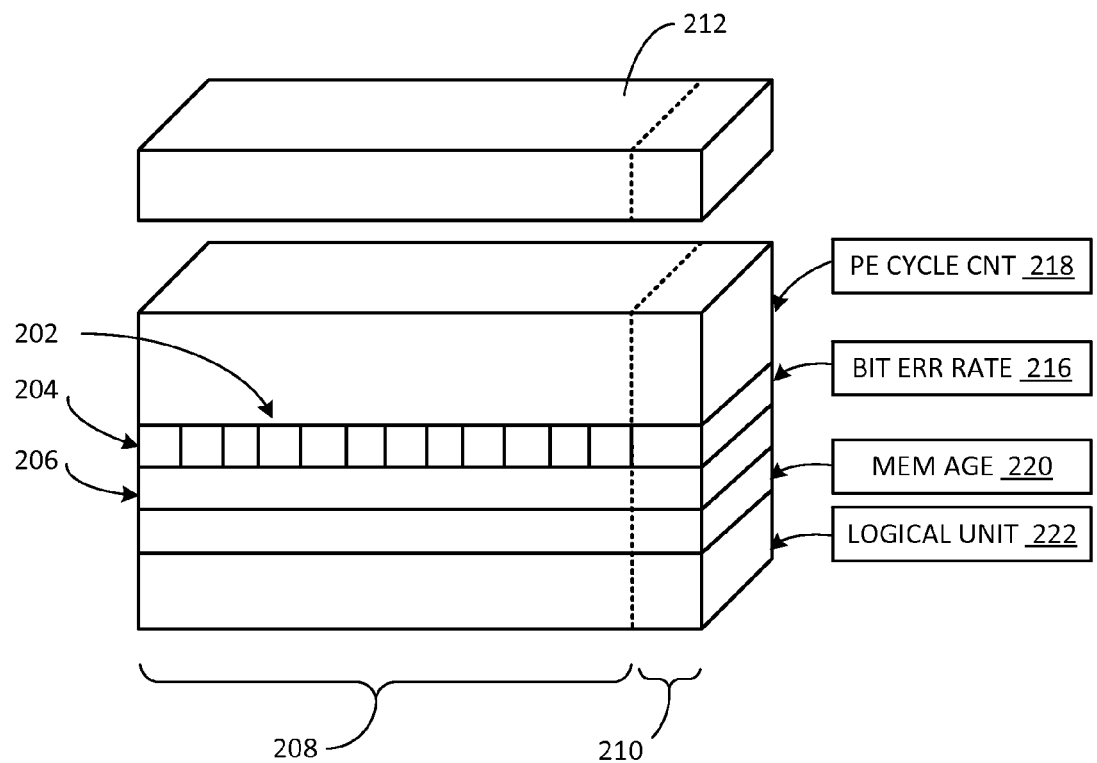
FIG. 2 is an example of a memory diagram.

Referring now to FIG. 2, therein is shown an example of a memory diagram. The memory diagram shows the data storage system 100 including memory pages 202, memory blocks 204, and a data register 212. The data storage system 100 can be formed using the memory dice 132 of FIG. 1. The memory dice 132 include the memory cells 136 of FIG. 1 for storing data.

The data storage system 100 can have a variety of storage capacities determined by the number of the memory dice 132 used to form the data storage system 100. For example, the data storage system 100 can include 2 gigabytes (GB) of flash memory, 8 GB, 16 GB, or other memory sizes.

The data storage system 100 can include a number of the memory blocks 204. The memory blocks 204 are portions of the memory array 106 of FIG. 1. For example, the data storage system 100 with capacity of 2 GB can have 4,096 of the memory blocks 204.

The memory blocks 204 can be on different logical units 222. The logical units 222 are a group of the memory blocks on the memory dice 132 which are single threaded and allow only one operation at a time. The logical units 222 can be a complete one of the memory dice 132, logical memory partitions, or a combination thereof. A die is a physical memory element composed of a number of the memory blocks that are accessed via one single CE (chip enable). The logical units 222 (LUN) is a group of logical erase blocks on a die which are single threaded and only one operation is allowed at a time.

The memory blocks 204 can include erase blocks 206. The erase blocks 206 are the smallest unit of memory that can be erased as a single entity at one time.

There are a number of different configurations for the data storage system 100 that use block based non-volatile random access memory (NVRAM) or NAND flash memory. The erase command can cause latencies will increase as the age of the memory increases.

During the normal operation of the data storage system 100, blocks of memory are required to be erased for a number of reasons. One of the memory blocks 204, such as the erase blocks 206, must be erased to re-write one of the memory blocks 204. While the erase command is executing no other operations, other than status reads, can be executed on the logical units 222 where the erase blocks 206 reside.

The data in the logical units 222 of the erase blocks 206 being erased is not available for use by other commands until the erase command has completed. Thus, a host read operation received at the start of the erase command can have a latency of the read operation plus the executing erase operation. Latency can be defined as the amount of time it takes the storage device to respond to a host request. Read latency is the amount of time it takes between receiving the host read request and when the read data starts flowing back to the host.

Each of the erase blocks 206 can have a program erase cycle count 218. When one of the erase blocks 206 is erased, then the program erase cycle count 218 can be incremented. The program erase cycle count 218 can be one factor used to determine the age or level of wear of one of the memory blocks 204. The program erase cycle count 218 is a measure of the level of usage within one of the erase blocks 206. The flash memory devices, such as NAND flash, have a limited number of useful program erase cycles. The program erase cycle count 218 can be a base level determination of how data is replaced within the erase blocks 206. NAND flash memory and other memory types have a limited number of useful program erase cycles.

During the normal operation of the data storage system 100, one of the erase blocks 206 can be erased for a variety of reasons. For example, in NAND flash memory, the erase blocks 206 must be erased before being re-written with a given set of data for the memory blocks 204.

The memory blocks 204 can be divided into the memory pages 202. The memory pages 202 are the smallest group of data bytes that can be read or written in the data storage system 100. The memory pages 202 are the smallest addressable unit of memory that can be programmed. For example, each of the memory blocks 204 can have 64 of the memory pages 202.

The memory pages 202 include a data area 208 and a spare area 210. The data area 208 is a group of memory cells used to store user data. The data area 208 can be various sizes. For example, the data area 208 of one of the memory pages 202 can be 2,048 bytes.

The spare area 210 is a group of memory cells to store metadata about the data area 208. For example, the spare area 210 can include error correction code information, status information, or a combination thereof. The spare area 210 can have a variety of sizes. For example, the spare area 210 can be 128 bytes. The memory pages 202 can have a size of 4,224 bytes for the data area 208 and the spare area 210.

The memory array 106 of FIG. 1 can be updated by erasing the memory blocks 204 and programming new data into the memory blocks 204 that have been erased. Programming the memory blocks 204 writes data into the memory blocks 204.

Reading one of the memory pages 202 can result in reading errors where one or more of the bits in the memory pages 202 are incorrect. The number of individual bit errors in a stream of data is described as a bit error rate 216. The bit error rate 216 (BER) is defined as numbers of incorrect bits in a data stream stored in the data storage system 100. The incorrect bits can be detected within a code word protected by an error-correcting code (ECC).

The code word refers to a group of data bytes covered by a single instance of multiple ECC parity words. The error-correcting code refers to parity or redundant data generated over a set of host or user data grouped into the code word. The bit error rate 216 is the number of incorrect bits in a data stream stored in the flash memory.

The data storage system 100 can include a memory age 220 associated with different memory elements. The memory age 220 is a value indicating the level of usage of a memory element. The memory age 220 can indicate how long a storage system or a memory component has existed or has been in operation. For example, the memory age 220 can be based on a number of erase cycles, how long it has been since the last time an erase block was written, an average BER an erase block is yielding, a temperature at which a device has been run, or a combination thereof.

The memory age 220 can be calculated based on age metrics 221. The age metrics 221 are values for indicating the level of wear of the erase blocks 206. The age metrics 221 can also include the bit error rate 216, the temperature, calendar age, usage cycles, or a combination thereof. In another example, the age metrics 221 can be influenced by the program erase cycle count 218.

There are numerous methods for measuring the memory age 220. For example, the memory age 220 can be on the value of one of the age metrics 221 such as the bit error rate 216, temperature, program time, optimal read threshold, erase time, or a combination thereof. The memory age 220 is an estimate of the amount of wear on the flash memory element.

The memory age 220 can represent a variety of memory elements. For example, the memory age 220 can include the age of one of the memory dice 132, one of the memory blocks 204, one of the memory pages 202, one of the erase blocks 206, one of the memory cells, or a combination thereof.

Figure 3:
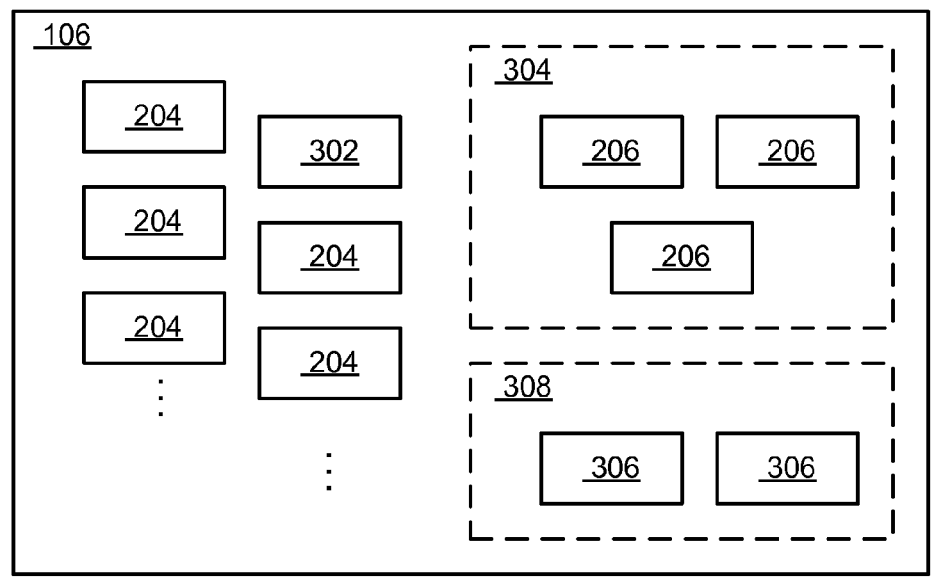
FIG. 3 is shown an example of a memory block diagram.

Referring now to FIG. 3 therein is shown an example of a memory block diagram. The memory block diagram can describe the memory configuration of the data storage system 100 of FIG. 1. The data storage system 100 can include the memory blocks 204, the erase blocks 206, defect blocks 306, a target block 302, an erase block pool 304, and a defect pool 308.

The memory blocks 204 are units of memory. The memory blocks 204 with content that is no longer required can be designed as the erase blocks 206 and allocated to the erase block pool 304. The erase block pool 304 is the set of erase blocks 206 that can be recycled and erased before being rewritten. The target block 302 is one of the memory blocks 204 where a read or write operation can be performed.

The defect pool 308 is a list of defect blocks 306 that are designated defective and not reused. One of the erase blocks 206 can be assigned to the defect pool 308 and designated one of the defect blocks 306 if the erase operation fails and one of the erase blocks 206 cannot be erased. The defect block 306 can have an erase failed status 310 to indicate that the erase operation has failed.

Figure 4:
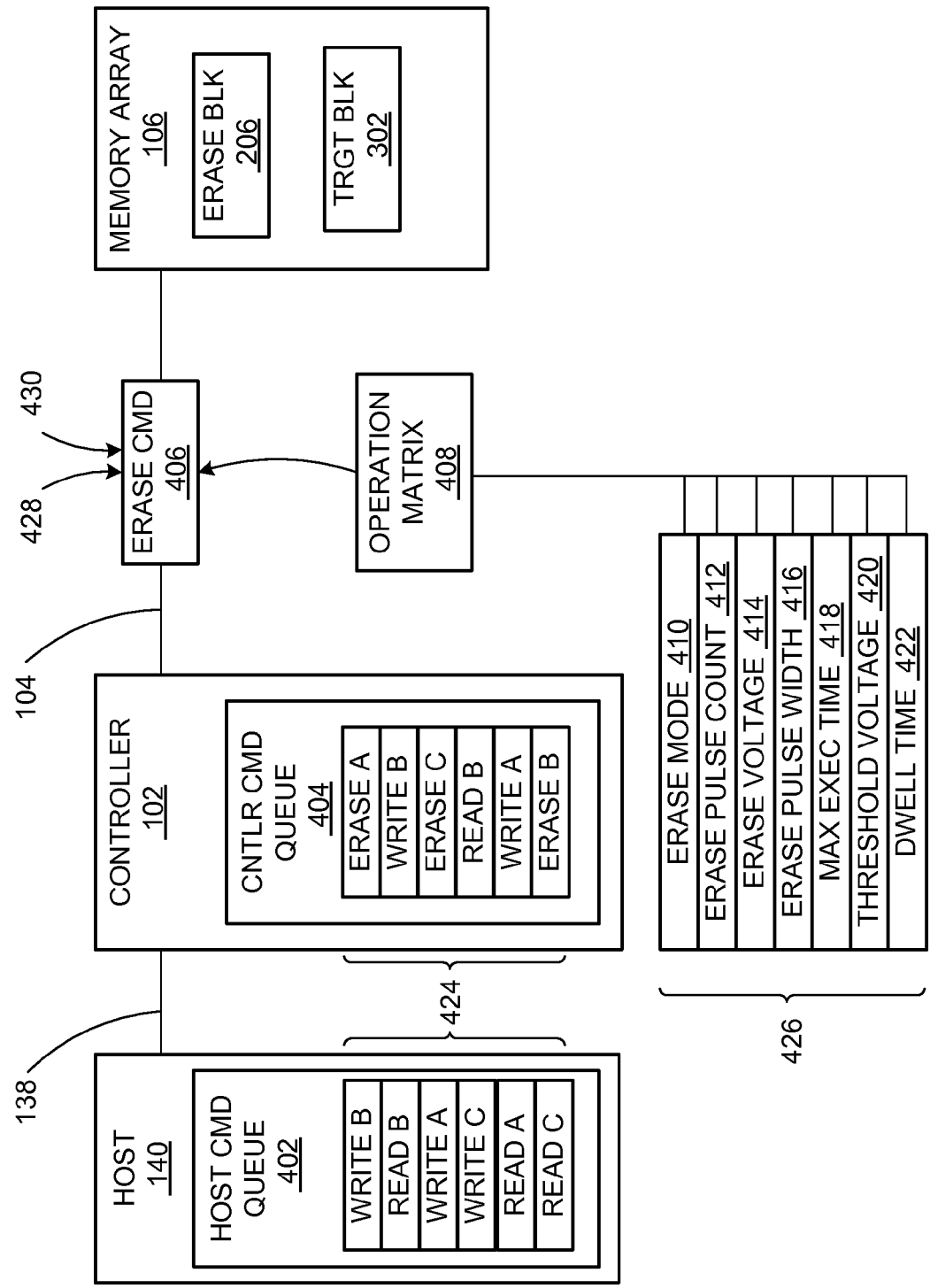
FIG. 4 is shown an example of the data storage system.

Referring now to FIG. 4 therein is shown an example of the data storage system 100. The data storage system 100 of FIG. 1 can include the controller 102 coupled to the memory array 106.

The data storage system 100 can be coupled to the host device 140 with the digital connection 138. The host device 140 can include a host command queue 402 for holding data operation commands 424 for the data storage system 100. The data operation commands 424 are instructions for manipulating data. The data operation commands 424 can include read, write, erase, status, set parameter, or a combination thereof.

The host command queue 402 can include an ordered set of commands for manipulating data in the data storage system 100 such as read, write, erase, status, or a combination thereof. The data operation commands 424 in the host command queue 402 can be transferred to the controller 102 for execution.

The data storage system 100 can include the controller 102 coupled to the memory array 10 with the memory bus 104. The controller 102 can include a controller command queue 404.

The controller command queue 404 is a structure for holding the data operation commands 424. The controller command queue 404 can include the data operation commands 424 from the host command queue 402 and local commands generated within the controller 102. The controller command queue 404 can include an ordered set of commands for manipulating data in the memory array 106. For example, the controller command queue 404 can include commands such as read, write, erase, status, or a combination thereof.

The controller command queue 404 can include a variety of the data operation commands 424. For example, the controller command queue 404 can include one of the data operation commands 424 to erase one of the erase blocks 206. The controller command queue 404 can include one of the data operation commands 424 to read the target block 302.

In an illustrative example, the controller 102 can select a command, such as an erase command 406, from the controller command queue 404 and transfer the erase command 406 to the memory array 106 for execution. The erase command 406 is an operation to erase one or more of the erase blocks 206. The erase command 406 can include an operation matrix 408 having configuration information.

The erase command 406 can include a command status 430. The command status 430 is a value indicating the result of an operation. For example, the command status 430 can indicate the success or failure of the erase command 406.

The operation matrix 408 is a set of values for controlling how the erase command 406 is performed. The operation matrix 408 can include erase operation values 426 for controlling the electrical properties of the erase command 406.

For example, the operation matrix 408 can include values such as an erase mode 410, an erase pulse count 412, an erase voltage 414, an erase pulse width 416, a maximum execution time 418, a threshold voltage 420, and a dwell time 422. The operation matrix 408 can include values for a complete erase operation, individual values for one or more partial erase operations, or a combination thereof.

The erase mode 410 can indicate the type of erase operation to perform. For example, the erase mode 410 can specify that a complete erase operation be performed in a single step. In another example, the erase mode 410 can specify that the complete erase operation be performed with one or more partial erase operations. The partial erase can be an erase-component that does not fully erase the memory (i.e., partially erases the memory). A final erase can be an erase-component that fully erases the memory. The final erase is the last erase component of a multiple-erase-component operation. The erase pulse count 412 can indicate the number of erase pulses to be used to perform the erase command 406. Using a lower value of the erase pulse count 412 can result in a partial erasure of one of the erase blocks 206.

The erase voltage 414 can indicate the value of the voltage to be used to perform the erase command 406. Using a lower value of the erase voltage 414 can result in a partial erasure of one of the erase blocks 206.

The erase pulse width 416 is the length of time the erase voltage 414 is applied to one of the erase blocks 206 during an erase operation, including a partial erase operation. An erase pulse is the erase voltage 414 applied for a period of time defined by the erase pulse width 416. Using a shorter value of the erase pulse width 416 for a given value of the erase voltage 414 can result in a partial erasure of the erase blocks 206.

The maximum execution time 418 is the maximum amount of time for performing a complete erase operation. The maximum execution time 418 can include one or more cycles of the erase pulse width 416.

The threshold voltage 420 is the voltage level indicating that one of the erase blocks 206 has been erased. The threshold voltage 420 can indicate the voltage setting applied to internal NAND comparators which determine the digital values stored in the NAND cells. After the erase operation, the voltage level of the erase blocks 206 can be compared to the threshold voltage 420 and if the voltage level of the erase blocks 206 meets or exceeds the threshold voltage 420, then the erase blocks 206 have been completely erased.

The dwell time 422 is the amount of time between successive erase or partial erase operations. Increasing the dwell time 422 between erase operations can increase the endurance, or effective lifetime, of the erase blocks 206. The term endurance can be the number of operations a memory device including NAND flash device tolerates over a given period of operational life of a data storage system including a solid state disk drive (SSD).

Each time an erase operation is performed, the act of erasing can temporarily change the charge defects in the material of the memory cells 136 of FIG. 1. The charge defects can dissipate automatically over time, so the longer the dwell time 422, the more of the defects self-repair. Defects accumulate over time, but if the dwell time 422 is too short, then defects can accumulate faster.

In another illustrative example, the erase command 406 can include the operation matrix 408 having individual values for each of four partial erase operations for one of the erase blocks 206. The operation matrix 408 can specify that the erase voltage 414 is initially set to a high value and decreased for each partial erase operation. The operation matrix 408 can specify that the erase pulse width 416 can remain constant for each partial erase operation.

The operation matrix 408 can specify the maximum execution time 418 indicating the maximum erase operation latency to determine when the erase operation should complete. The operation matrix 408 can specify the threshold voltage 420 used to determine if the erase operation has been successful. The operation matrix 408 can specify the dwell time 422 for scheduling the individual partial erase operations.

The operation matrix 408 can be used to perform an erase optimization 428. The erase optimization 428 is an operation to modify the behavior of the erase command 406. The erase optimization 428 can improve the performance of the erase command 406 by modifying the erase operation values 426 of the erase command 406. For example, the erase optimization 428 can change the erase voltage 414, the erase pulse width 416, and the dwell time 422 to improve the overall performance of the erase command 406.

It has been discovered that performing the erase command 406 with the operation matrix 408 increase flexibility and performance. By including variable operational parameters with each of the erase commands, the data storage system 100 of FIG. 1 can control the erase operation with finer granularity to increase flexibility and increase performance.

It has been discovered that performing the erase command 406 with the operation matrix 408 specifying the dwell time 422 increases the endurance of the data storage system 100. Optimizing the dwell time 422 can reduce the physical impact of the erase operation on the erase blocks 206 and increase the endurance or effective lifetime of the erase blocks 206.

It has been found that performing the erase command 406 with the dwell time 422 provides a longer duration of the overall erase operation which improves endurance. Configuring the modular erase operation to allow for a longer erase time results in higher endurance without sacrificing latency.

Figure 5:
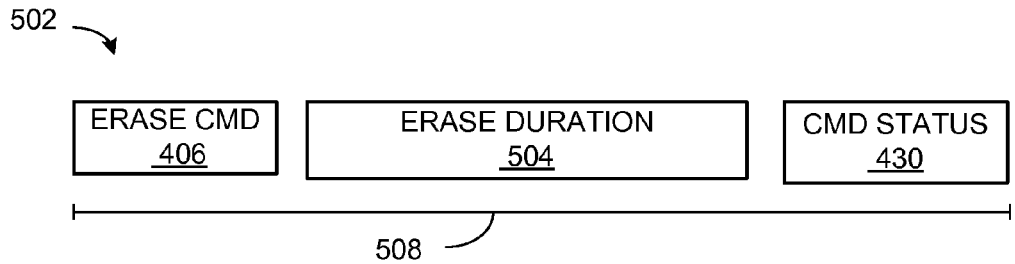
FIG. 5 is shown an example of an erase operation.

Referring now to FIG. 5 therein is shown an example of an erase operation 502. The erase operation 502 can erase one of the erase blocks 206 of FIG. 2 in a complete erase operation.

The erase operation 502 can include receiving the erase command 406, performing the erase command 406 over an erase duration 504, and providing the command status 430 when completed. The erase duration 504 is the time between receiving and completing the erase command 406. A complete erase time 508 can include receiving the erase command 406, the erase duration 504, and providing the command status 430. For example, a conventional flash memory system can perform a complete erase operation in the range of 3-30 milliseconds (ms). In another example, a flash memory system configured for maximum endurance can perform a complete erase operation in the range of 10-30 ms. The time for a complete erase operation would preferably be under 10 ms.

The time required to erase one of the erase blocks 206 can lengthen with use and the memory age 220 of FIG. 2 of the erase blocks 206. In another example, the erase time for one of the erase blocks 206 can start at 2 ms and gradually extend to as long as 25 ms by the end of the lifetime the data storage system 100 of FIG. 1.

Figure 6:
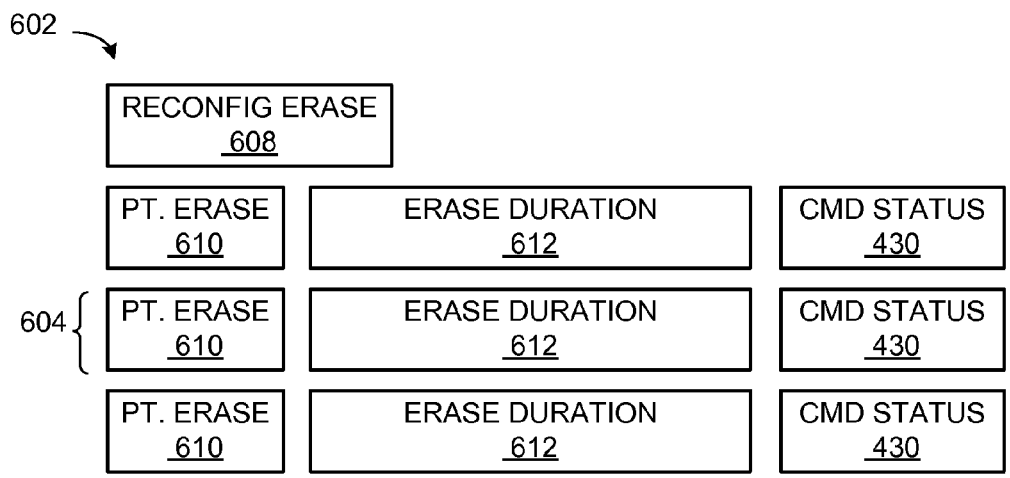
FIG. 6 is shown an example of an erase operation with erase components.

Referring now to FIG. 6 therein is shown an example of an erase operation 602 with erase components 604. The erase operation 602 can be partitioned into erase components 604 that can be performed sequentially. The erase components 604 can be configured once at initialization or boot time and not changed as the data storage system 100 of FIG. 1 operates.

The erase command 406 in a NAND flash memory can be broken up into segments by limiting the number of erase pulses in a given erase operation. By limiting the number of erase pulses, the erase operation may not complete with a single erase command but will not exceed a given amount of command processing time. The erase operation 602 is then composed of a number of the erase components 604.

The use of erase components allows the controlling firmware to interlace other operations to the die/LUN that is being erased with the component erase commands. The software can also perform "look ahead" operations the will stack a number of erase components together if there are no other host operations targeted for the device being erased.

The erase components 604 are a portion of the erase operation 602. Each of the erase components 604 can represent using the erase operation 602 configured with the operation matrix 408 of FIG. 4 to partially erase the erase blocks 206 of FIG. 2. The erase components 604 can be an erase command sent to the flash that is a component of a multiple-component flash erase operation. Due to pulse-count limits, one or more erase components can complete prior to the memory being fully erased.

The erase operation 602 can execute one or more of the erase components 604 until the erase operation 602 is complete. The erase operation 602 is complete when the command status 430 of FIG. 4 indicates a successful erasure. The command status 430 indicates the status at the end of the erase component 604.

The erase operation 602 can include a reconfigure erase function 608 for applying the operation matrix 408 to the erase components 604. The reconfigure erase function 608 can be performed at different times. For example, the reconfigure erase function 608 can be performed once at drive initialization time during manufacture. In another example, the reconfigure erase function 608 can be performed at drive boot time for the data storage system 100 and not changed as the data storage system 100 operates.

The erase operation 602 can receive a partial erase command 610 with the operation matrix 408 and erase one of the erase blocks 206. The partial erase command 610 can be performed according the settings in the operation matrix 408.

The erase operation 602 can include the erase duration 612. During the erase duration 612, the partial erase command 610 can operate on the memory array 106 of FIG. 1 to partially erase one of the erase blocks 206 and no other operations can be performed.

The erase operation 602 can provide the command status 430 when the erase components 604 have completed. The command status 430 indicates the status of the operation, such as the partial erase command 610. For example, the command status 430 can indicate that the partial erase command 610 resulted in an incomplete erase or a complete erase condition.

The data storage system 100 of FIG. 1 includes block based memory and can experience high latency times when the memory device being accessed is execution an erase operation. This is compounded toward the end of life when block erase times start to lengthen due to high use on the memory devices.

It has been discovered that executing the erase component 604 a number of times can reduce command latency. The erase blocks 206 can become erased as if a normal erase operation was executed by executing one or more of the erase components 604 which can provide a guaranteed value for the maximum execution time 418 of FIG. 4 which translated to a maximum latency time.

Figure 7:
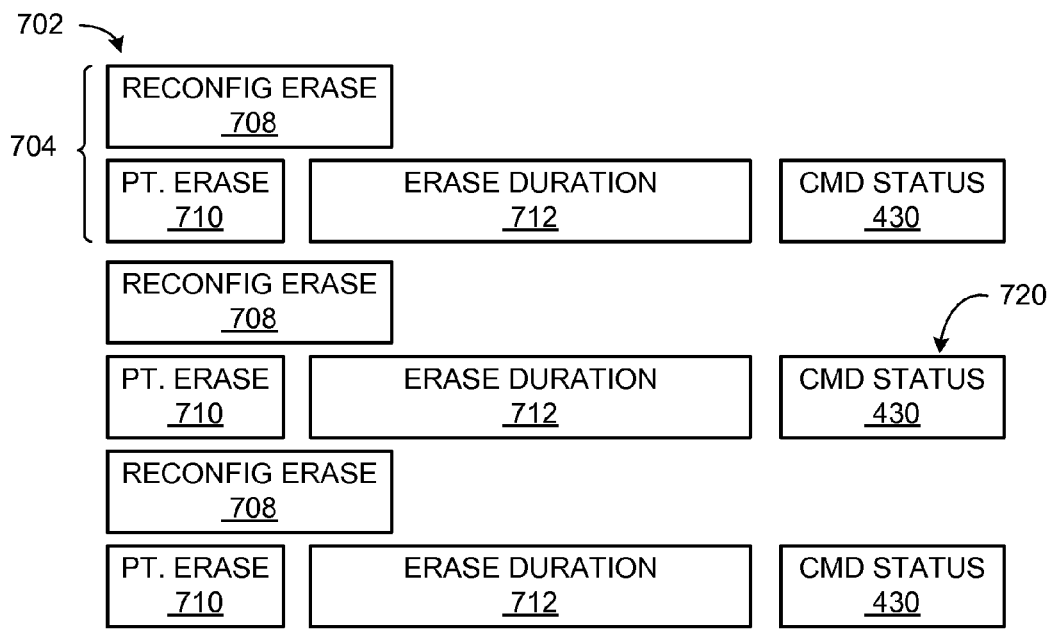
FIG. 7 is shown an example of an erase operation using modular erase components.

Referring now to FIG. 7 therein is shown an example of an erase operation 702 using modular erase components 704. The erase operation 702 can be partitioned into erase components 704 that can be performed sequentially.

The erase components 704 are a portion of the erase operation 702. Each of the erase components 704 can represent using the erase operation 702 configured with the operation matrix 408 of FIG. 4 to partially erase one of the erase blocks 206 of FIG. 2. The erase components 704 can include a reconfigure erase function 708, a partial erase command 710, an erase duration 712, and the command status 430 of FIG. 4.

The erase operation 702 can execute one or more of the erase components 704 until the erase operation 702 is complete. The erase operation 702 is complete when the command status 430 indicates a successful erasure. The command status 430 indicates the status at the end of the erase components 704.

The erase operation 702 can include the erase components 704 for performing a partial erase. Each of the erase components 704 can include the reconfigure erase function 708 for applying the operation matrix 408 to one of the erase components 704.

The reconfigure erase function 708 can be performed for each of the erase components 704 to provide fine grained control over the erase operation 702. The operation matrix 408 can include a set of parameters for each of the erase components 704.

The erase operation 702 can receive the partial erase command 702 with the operation matrix 408 and erase one of the erase blocks 206. The partial erase command 710 can be performed according the settings in the operation matrix 408.

The erase operation 702 can include the erase duration 712. During the erase duration 712, the partial erase command 702 can operate on the memory array 106 of FIG. 1 to partially erase one of the erase blocks 206 and no other operations can be performed.

The erase operation 702 can provide the command status 430 when the erase component 704 has completed. The command status 430 indicates the status of the operation, such as the partial erase command 710. For example, the command status 430 can indicate that the partial erase command 710 resulted in an incomplete erase or a complete erase condition. In another example, the command status 430 can indicate that a partial erase operation is in progress, such as an incomplete erase status 720.

It has been discovered that dynamically reconfiguring each of the erase components 704 based on the status received at the completion of the erase components 704 can increase the flexibility of the erase operation 702. Increasing the erase voltage 414 of FIG. 4 for each of the erase components 704 insures completion of the erase operation 702.

Figure 8:
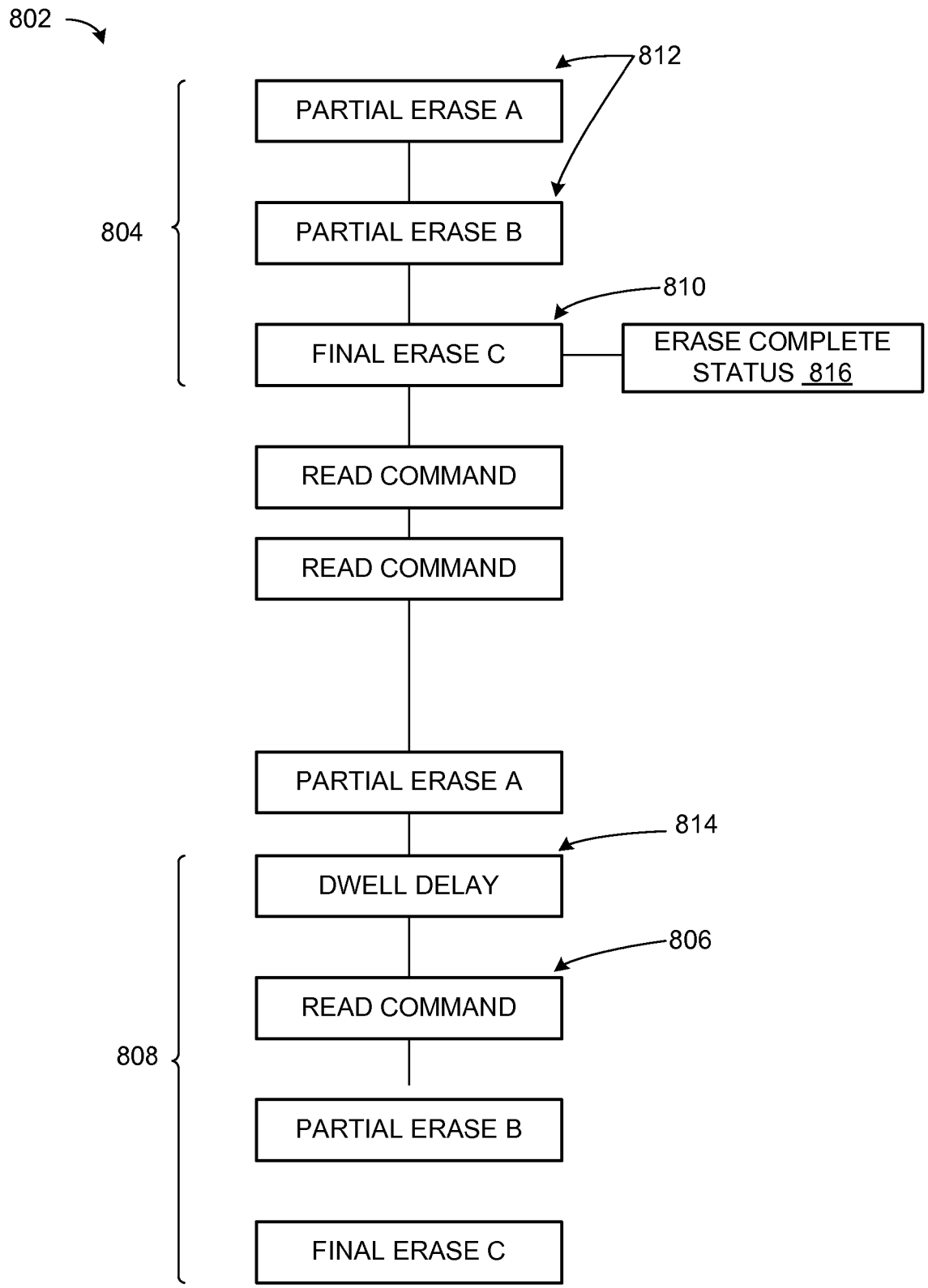
FIG. 8 is shown an example of an interleaved erase process.

Referring now to FIG. 8 therein is shown an example of an interleaved erase process 802. The interleaved erase process 802 can include intervening commands 806 between some of the partial erase operations.

The intervening commands 806, such as a read or write command, can be the data operation commands 424 of FIG. 4.

The intervening commands 806 can be performed between the partial erase operations to reduce command latency.

An erase operation 804 can include a set of partial erase components 812 that result in a complete erase operation. The partial erase components 812 are erase components that do not fully erase the erase blocks 206 of FIG. 2. Implementing the erase operation 804 as a set of the partial erase operations enables the execution of the intervening commands 806 between the partial erase components 812.

For example, the erase operation 804 can include two of the partial erase components 812 and a final erase component 810. The erase operation 804 can include the final erase component 810. The final erase component 810 is the last erase component of a multiple erase-component operation. The command status 430 of FIG. 4 can indicate the erase operation 804 has successfully completed, such as an erase complete status 816.

The erase blocks 206 of FIG. 2 are completely erased after the final erase component 810. After the erase operation 804 has completed, the interleaved erase process 802 can include other of the data operation commands 424 that do not overlap with the erase operation 804.

The interleaved erase process 802 can include an interleaved erase operation 808 having a set of partial erase operations with one or more of the intervening commands 806 interleaved within the partial erase operations. Interleaving the intervening commands 806 between the partial erase operations can avoid high latencies for host commands. The high latencies can be the result of waiting for the entire erase operation to complete.

The interleaved erase operation 808 can include a dwell delay 814 after one of the partial erase operations. The dwell delay 814 is a pause before executing another of the partial erase operations for an amount of time indicated by the dwell time 422 of FIG. 4. The dwell delay 814 for the dwell time 422 can help reduce wear on the erase blocks 206.

Separating the interleaved erase operation 808 into one or more of the partial erase operations can support having a dwell time delay between the partial erase operations. Separating the partial erase operations from one another for the dwell time 422 can result in lower wear on the data storage system 100 of FIG. 1 and extend the operational lifetime of the data storage system 100.

It has been discovered that executing intervening commands 806 between the erase components 704 of FIG. 7 can reduce command latency. Performing the intervening commands 806 to execute without waiting for the complete erase operation to finish allows the intervening commands 806 execute faster and to have a lower command latency.

Figure 9:
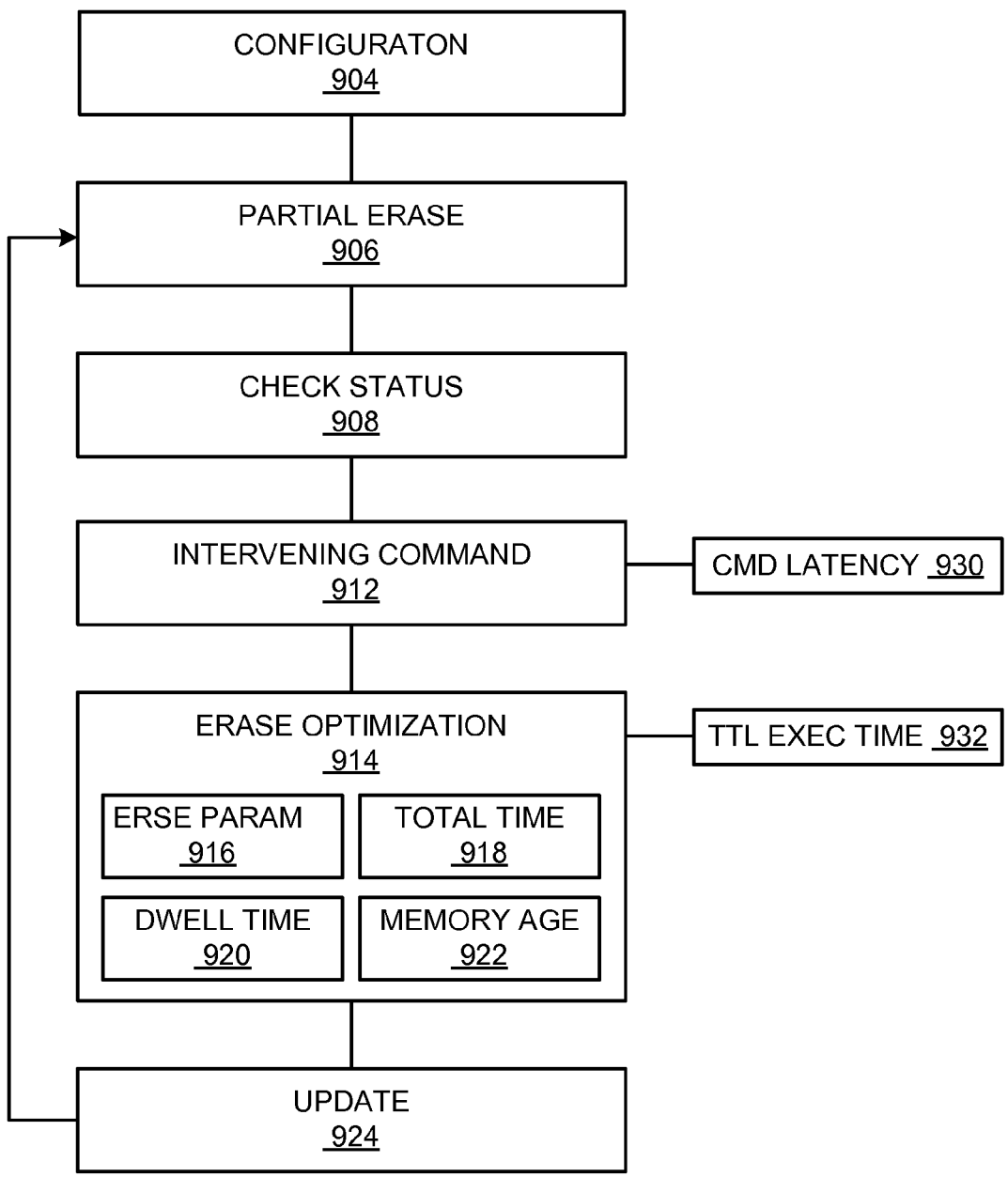
FIG. 9 is shown an example of an erase process.

Referring now to FIG. 9 therein is shown an example of an erase process 902. The erase process 902 can perform the erase operation with the intervening commands 806 of FIG. 8 between the partial erase operations.

The erase process 902 can include a configuration module 904, an partial erase module 906, a check status module 908, an intervening command module 912, an optimization module 914, and an update module 924. The optimization module 914 can include an erase parameter module 916, a total time module 918, a dwell time module 920, and a memory age module 922.

The term "module" referred to herein can include software, hardware, or a combination thereof in the present invention in accordance with the context in which the term is used. For example, the software can be machine code, firmware, embedded code, and application software. Also for example, the hardware can be circuitry, processor, computer, integrated circuit, integrated circuit cores, a microelectromechanical system (MEMS), passive devices, environmental sensor, or a combination thereof.

The configuration module 904 can configure the erase process 902 by receiving the operation matrix 408 of FIG. 4 and calculating the erase operation values 426 of FIG. 4 for each of the erase components 704 of FIG. 7. The configuration module 904 can determine the values for the erase mode 410 of FIG. 4, the erase pulse count 412 of FIG. 4, the erase voltage 414 of FIG. 4, and the erase pulse width 416 of FIG. 4. The configuration module 904 can process the values for the maximum execution time 418 of FIG. 4, the threshold voltage 420 of FIG. 4, and the dwell time 422 of FIG. 4.

For example, the configuration module 904 can use the erase mode 410 to determine the type of erase to be performed. If the erase mode 410 indicates a complete erase operation, then the erase process 902 can be performed as a single complete erase operation. If the erase mode 410 indicates a partial erase operation, then the erase process 902 can be performed as a series of partial erase components to support the execution of intervening commands 806.

In another example, the configuration module 904 can set the operational values for the erase pulse count 412, the erase voltage 414, and the erase pulse width 416. The operational values can determine the degree of change in the charge performed on the memory cells 136 of FIG. 1 of one of the erase blocks 206 of FIG. 2 during one of the erase components 704.

In yet another example, the configuration module 904 can determine the amount of the dwell time 422 between the current one of the erase components 704 and the next one of the erase components 704. The delay of the dwell time 422 can lower the wear on the memory cells 136 and increase the functional lifetime of the data storage system 100 of FIG. 1.

In a further example, the configuration module 904 can adjust the behavior of the erase command 406 of FIG. 4 based on the maximum execution time 418. The configuration module 904 can calculate the operational values for the erase command 406 based on the value of the maximum execution time 418. A smaller value for the maximum execution time 418 can result in a higher value for the erase voltage 414, a fewer number of the erase components 704, and a lower value for the dwell time 422 to insure that the partial erase operations and the intervening commands 806 can complete within the maximum execution time 418. The maximum execution time 418 can be used to enforce a specific maximum command latency for the data storage system 100.

The configuration module 904 can set one or more of the operational values for the erase process 902. When the configuration module 904 is completed, the control flow can pass to the partial erase module 906.

The partial erase module 906 can perform the partial erase operation on the selected ones of the erase blocks 206 using the operational values from the operation matrix 408. The partial erase module 906 can form part of one of the erase components.

When the partial erase module 906 is actively performing the partial erase operation by applying the erase voltage 414 to the erase blocks 206, no other operation can take place on the logical units 222 of FIG. 2 on the erase blocks 206. The partial erase module 906 can set the command status 430 of FIG. 4 for the selected ones of the erase blocks 206 to indicate that the erase command 406 is in progress in the logical units 222.

The partial erase module 906 can set the command status 430 to indicate the status of the erase command 406. The command status 430 can indicate that the erase blocks 206 are completely erased and ready for use or that the partial erase is still in progress and another of the erase components 704 is still required to complete the erase command 406.

The partial erase module 906 can implement the dwell delay 814 of FIG. 8 for the dwell time 422 to increase endurance. When the partial erase module 906 has completed, the control flow can pass to the check status module 908.

The check status module 908 can determine if the erase command 406 has completely erased the selected ones of the erase blocks 206 by checking the command status 430. If the command status 430 indicates that the erase blocks 206 have been completely erased, then the check status module 908 can calculate and update the memory age 220 for the erase blocks 206 and then the erase command 406 can terminate.

If the command status 430 matches the erase failed status 310 of FIG. 3, then the erase operation has failed and the erase blocks 206 can be processed based on the command status 430. For example, the erase blocks 206 having the erase failed status 310 can be reconfigured for an erase retry, assigned to the defect pool 308 of FIG. 3, or a combination thereof. If the command status 430 indicates that the erase blocks 206 have not been completely erased, then the control flow can pass to the intervening command module 912.

The intervening command module 912 can identify and execute one or more of the intervening commands 806 in the intervals between the erase components 704. Executing the intervening commands 806 without waiting for the complete erase operation can reduce a command latency 930 for the intervening commands 806. The command latency 930 is the amount of time required for a command to execute.

The intervening command module 912 can identify one of the intervening commands 806 by searching a command queue to identify any of the data operation commands 424 of FIG. 4 that are scheduled to operate during the execution of the erase command 406. The command queue is a list of data operations to be performed. For example, the command queue can include the controller command queue 404 of FIG. 4, the host command queue 402 of FIG. 4, or a combination thereof.

The commands in the command queue, such as a read command or a write command, can operate on the target block 302 of FIG. 3. Once an available command has been identified in the command queue, the intervening command module 912 can check to see that the target block 302 of the identified command is on a different one of the logical units 222 from the erase blocks 206. The logical units 222 can include an entire memory die.

If the logical units 222 of the target block 302 is different from that of the erase blocks 206, then the command can be designated the intervening commands 806 and the intervening command module 912 can execute one of the intervening commands 806 on the target block 302.

When the intervening commands 806 have completed, the intervening command module 912 can evaluate whether another command can be executed before performing another partial erase. For example, the intervening command module 912 can calculate whether another of the intervening commands 806 can be performed within the time interval of the dwell time 422. In another example, the intervening command module 912 can calculate whether another of the intervening commands 806 can be performed without exceeding the maximum execution time 418 of FIG. 4.

The intervening command module 912 can execute the intervening commands 806 until the available commands are exhausted or until the available time has ended. The intervening command module 912 can perform more than one of the intervening commands 806 from the command queue sequentially to improve performance, including different types of the intervening commands 806. The intervening command module 912 can perform one or more different ones of the intervening commands 806 between one of the erase operations and another of the erase operations. After the final one of the intervening commands 806 has been completed, the intervening command module 912 can pass the control flow to the optimization module 914.

The optimization module 914 can calculate the operational values for one of the erase components 704. The optimization module 914 can include the erase parameter module 916, the total time module 918, the dwell time module 920, and the memory age module 922. The optimization module 914 can perform the erase optimization 428 of FIG. 4 by changing the operational values for one of the erase components 704.

The optimization module 914 can manage the implementation of a total execution time 932 for the erase operation by modifying the operational values for the erase components 704. The optimization module 914 can make sure the total execution time 932 for the erase operation is less than or equal to the maximum execution time 418.

The optimization module 914 can pass control to one or more of the modules depending on the internal configuration of the optimization module 914. For example, the optimization module 914 can execute the other modules based on the erase mode 410. In another example, the optimization module 914 can select other modules for execution based on a predefined configuration. After the optimization module 914 has completed, the control flow can pass to the update module 924.

The erase parameter module 916 can calculate the erase operation values for the next partial erase operation. The erase operation values can include the erase pulse count 412, the erase voltage 414, the erase voltage 414, and the erase pulse width 416.

The erase operation values can vary in different ways. For example, the erase parameter module 916 can schedule a sequence of increasing values for the erase pulse count 412, the erase voltage 414, and the erase pulse width 416. The values can increase individually or together with each other.

In another example, the erase parameter module 916 can schedule a sequence of decreasing values for the erase pulse count 412, the erase voltage 414, and the erase pulse width 416. The values can decrease individually or together with each other.

The total time module 918 can determine whether another of the intervening commands 806 can be performed within the maximum execution time 418. The total time module 918 can insure that the erase process 902 completes within the interval defined by the maximum execution time 418.

The dwell time module 920 can determine the value of the dwell time 422. The dwell time 422 is the amount of time the data storage system 100 can wait after performing the partial erase operation to reduce wear on the memory cells 136.

The erase operation values can vary in different ways. The dwell time 422 can be a fixed value, a calculated value based on the memory age 220 of FIG. 2 of the erase blocks 206, a value based on the erase operation values, or a combination thereof. The dwell time 422 can vary for each of the erase components 704 and for each of the erase blocks 206.

For example, the dwell time module 920 can schedule a sequence of increasing values for the dwell time 422 for each of the erase components 704. In another example, the dwell time module 920 can schedule a sequence of decreasing values for the dwell time 422 for each of the erase components 704.

The memory age module 922 can calculate the erase operation values for the next partial erase operation based on the memory age 220 of each of the erase blocks 206. The erase operation values can include the erase pulse count 412, the erase voltage 414, the erase voltage 414, and the erase pulse width 416.

The erase pulse count 412 can be calculated based on the memory age 220 of the erase blocks 206. As the memory age 220 of the erase blocks 206 increases, the erase blocks 206 can require a higher value for the erase pulse count 412 to achieve the same level of erasure or partial erasure.

The erase voltage 414 can be calculated based on the memory age 220 of the erase blocks 206. As the memory age 220 of the erase blocks 206 increases, the erase blocks 206 can require higher values for the erase voltage 414 to achieve the same level of erasure or partial erasure.

The erase pulse width 416 can be calculated in a variety of ways. For example, the erase pulse width 416 can be calculated based on the memory age 220 of the erase blocks 206. As the memory age 220 of the erase blocks 206 increases, the erase blocks 206 can require longer values for the erase pulse width 416 to achieve the same level of erasure or partial erasure.

The update module 924 can configure the erase process 902 by receiving the operation values calculated in the optimization module 914 and configuring the next partial erase operation based on the erase operation values 426. After completion, the update module 924 can pass the control flow back to the partial erase module 906.

The modules of the erase process 902 can be implemented in software, hardware, or a combination thereof. For example, the erase process 902 can be performed by executing the software 122 of FIG. 1 with the control unit 110 of FIG. 1. The software 122 can implement the erase process 902 by sending configuration commands to tune the erase settings on the data storage system 100 or by merely performing a partial erase operation multiple times.

The erase process 902 can be performed in hardware as dedicated hardware units and then providing a command interface to access the erase components. The erase process 902 can be implemented as a custom command or by modifying the erase command 406 of the data storage system 100.

The physical transformation resulting from the erase process 902 results in the change of charge levels in the memory cells 136 of the data storage system 100. As charge level changes in the physical world, such as the erase process 902 proceeding with the cycle of partial erase operations and executing the intervening commands 806, the incremental change in the charge level in the memory cells 136 creates additional information about the charge level that is used for continued operation of the data storage system 100 and to determine further changes in the charge level to complete the erase process 902.

The controller 102 can use the software 122 executing on the control unit 110 to implement the erase process 902. For example, the software 122 can include the configuration module 904, the partial erase module 906, the check status module 908, the intervening command module 912, the optimization module 914, and the update module 924. The software 122 can include the erase parameter module 916, the total time module 918, the dwell time module 920, and the memory age module 922.

The controller 102 can implement the erase process 902 using the control unit 110 and the software 122 to control the error correction code unit 112 of FIG. 1, the host interface 114 of FIG. 1, the memory interface 116, of FIG. 1, the read only memory 118 of FIG. 1, the random access memory 120 of FIG. 1, and the database 124 of FIG. 1. The controller 102 can implement the erase process 902 using the control unit 110 and the software 122 to control the memory array 106 including the array logic 130 of FIG. 1, the memory dice 132 of FIG. 1, the cell array 134 of FIG. 1, and the memory cells 136.

The control unit 110 can execute the software 122 for the configuration module 904 to configure the memory array 106. The control unit 110 can execute the software 122 for the partial erase module 906 to partially erase the memory array 106. The control unit 110 can execute the software 122 for the check status module 908 to determine the status of the erase operation.

The control unit 110 can execute the software 122 for the intervening command module 912 to perform the intervening command 806. The control unit 110 can execute the software 122 for the optimization module 914 to calculate the erase operation values 426. The control unit 110 can execute the software 122 for the update module 924 to update the operation matrix 408.

The data storage system 100 describes the module functions or order as an example. The modules can be partitioned differently. For example, the partial erase module 906 and the check status module 908 can be combined. Each of the modules can operate individually and independently of the other modules.

Furthermore, data generated in one module can be used by another module without being directly coupled to each other. For example, the optimization module 914 can receive the command status 430 from the check status module 908.

It has been discovered that performing the erase operation 804 with the intervening commands 806 can reduce host access latency for the block-based NAND flash memory. By enabling the intervening commands 806 to complete before the complete erasure of the erase blocks 206 can allow more commands to execute in less time providing low latency for the intervening commands 806 even as the erase time increases as the memory age 220 of the erase blocks 206 increase.

It has been discovered that performing the erase operation 804 with the intervening commands 806 can reduce complexity and simplify memory operations. Because the erase operations and the intervening commands 806 can be performed without memory conflict, the erase operation does not need to be interrupted and restarted at a later time.

It has been discovered that performing the erase operation 804 with the intervening commands 806 can provide consistent performance over time as the memory age 220 of the erase blocks 206 increases. By interleaving the intervening commands 806, the command latency can be decoupled from the actual erase time and provide more consistent operation.

It has been discovered that varying the erase voltage 414 and the erase pulse width 416 between the erase components 704 can increase flexibility. Changing the erase voltage 414 and the erase pulse width 416 between the erase components 704 allows the data storage system 100 to dynamically adapt to the amount of charge in memory cells 132 to perform a complete erase.

It has been discovered that varying the erase voltage 414 and the erase pulse width 416 between the erase components 704 based on the memory age 220 of the erase blocks 206 can increase flexibility. Adjusting the erase voltage 414 and the erase pulse width 416 based on the memory age 220 of the erase blocks 206 allows the data storage system 100 to dynamically adapt to the amount of charge in memory cells 132 to perform a complete erase.

It has been discovered that providing a delay for the dwell time 422 between the erase components 704 can enhance endurance and increase operational lifetime. Allowing the memory cells 136 to recover between the erase components 704 by pausing for the dwell time 422 reduces wear on the physical structure of the NAND flash memory and induces less wear. Endurance is enhanced by performing gentler erase operations over a longer time period. To compensation for erase operations that exceed the maximum read latency, the erase operation can be partitioned into multiple partial erase operations to allow performing the intervening commands 806 between the partial erase operations.

It has been discovered that varying the dwell time 422 between the erase components 704 based on the memory age 220 of the erase blocks 206 can increase operational lifetime. Allowing the erase blocks 206 to recover between the erase components 704 by dynamically increasing the dwell time 422 for erase blocks 206 having a higher value of the memory age 220 reduces wear on the physical structure of the NAND flash memory and induces less wear.

Figure 10:
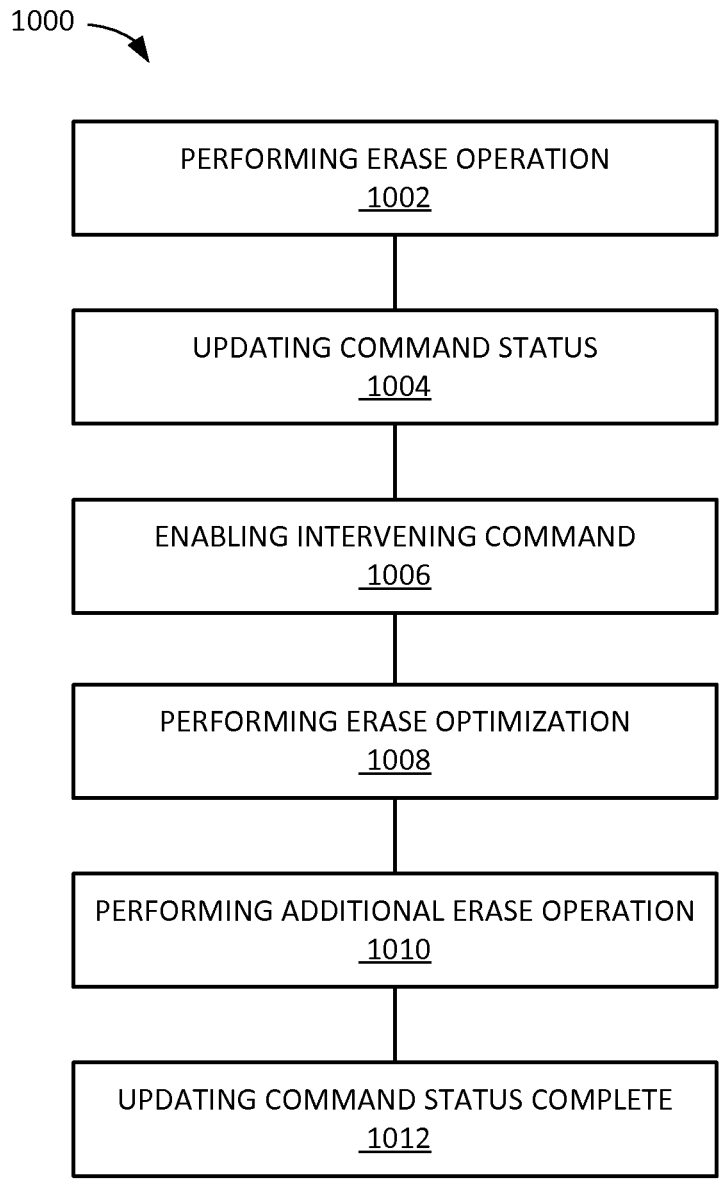
FIG. 10 is a flow chart of a method of data management with modular erase in the data storage system in a further embodiment of the present invention.

Referring now to FIG. 10, therein is shown a flow chart of a method 1000 of data management with modular erase in the data storage system 100 of FIG. 1 in a further embodiment of the present invention. The method 1000 of data management with modular erase in a data storage system with a memory array having an erase block and a target block with the target block in a logical unit separate from the erase block includes: performing an erase operation on the erase block, the erase operation having an operation matrix configured for partial erasing of the erase block in a block 1002; updating a command status for the erase block in a block 1004; enabling an intervening command on the target block based on the command status indicating an incomplete erase status with the intervening command updating the command status in a block 1006; performing an erase optimization based on the command status in a block 1008; performing an additional erase operation based on the erase optimization in a block 1010; and updating the command status to an erase complete status based on the additional erase operation in a block 1012.

Thus, it has been discovered that the data storage system of the present invention furnishes important and heretofore unknown and unavailable solutions, capabilities, and functional aspects for a data storage system with modular erase. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The claimed invention provides a method of data management with modular erase in a data storage system with a memory array having an erase block and a target block with the target block in a logical unit separate from the erase block including: performing an erase operation on the erase block, the erase operation having an operation matrix configured for partial erasing of the erase block; updating a command status for the erase block; enabling an intervening command on the target block based on the command status indicating an incomplete erase status with the intervening command updating the command status; performing an erase optimization based on the command status; performing an additional erase operation based on the erase optimization; and updating the command status to an erase complete status based on the additional erase operation.

The claimed invention provides a data storage system including: a configuration module for configuring a memory array having an erase block and a target block, the target block in a logical unit separate from the erase block; a partial erase module coupled to the configuration module for performing an erase operation on the erase block, the erase operation having an operation matrix configured for partial erasing of the erase block, the erase operation updating a command status for the erase block, and for performing an additional erase operation based on an erase optimization; an intervening command module coupled to the partial erase module for performing an intervening command on the target block based on the command status indicating an incomplete erase status with the intervening command updating the command status; an optimization module coupled to the intervening command module for performing an erase optimization based on the command status; and an update module coupled to the optimization module for updating the command status to an erase complete status based on the additional erase operation.

The claimed invention provides a data storage system including: a controller coupled to a memory array having an erase block and a target block, the target block in a logical unit separate from the erase block; a control unit coupled to the memory array for performing an erase operation on the erase block, the erase operation having an operation matrix configured for partial erasing of the erase block, the erase operation updating a command status for the erase block, and for performing an additional erase operation based on an erase optimization; a memory interface coupled to the control unit for performing an intervening command on the target block based on the command status indicating an incomplete erase status with the intervening command updating the command status; an array logic coupled to the memory interface for performing an erase optimization based on the command status; and a database coupled to the control unit for updating the command status to an erase complete status based on the additional erase operation.

What is claimed is:

1. A method of data management with modular erase in a data storage system with a non-volatile memory array having an erase block and a target block with the target block in a logical unit separate from the erase block, comprising:
    performing an erase operation on the erase block, the erase operation having an operation matrix configured for partial erasing of the erase block;
    updating a command status for the erase block;
    enabling an intervening command on the target block, based on the command status indicating an incomplete erase status, with the intervening command updating the command status;
    performing an erase optimization based on the command status;
    performing an additional erase operation based on the erase optimization; and
    updating the command status to an erase complete status based on the additional erase operation.

2. The method as claimed in claim 1 further comprising:
calculating a memory age of the erase block based on age metrics; and
performing the erase optimization based on the memory age.

3. The method as claimed in claim 1 wherein:
performing the erase optimization includes calculating erase operation values for the operation matrix; and
performing the additional erase operation with the erase operation values.

4. The method as claimed in claim 1 further comprising:
calculating a dwell time for the erase block; and
implementing a dwell delay for the dwell time before the additional erase operation to increase endurance.

5. The method as claimed in claim 1 wherein performing the intervening command includes implementing a total execution time for the erase operation that is less than a maximum execution time.

6. The method as claimed in claim 1 wherein enabling the intervening command includes performing more than one of the intervening command between the erase operation and another of the erase operation.

7. A data storage system comprising:
a controller coupled to a non-volatile memory array having an erase block and a target block, the target block in a logical unit separate from the erase block;
a configuration module for configuring an erase operation to be performed on the erase block;
a partial erase module coupled to the configuration module for performing the erase operation on the erase block, the erase operation having an operation matrix configured for partial erasing of the erase block, the erase operation updating a command status for the erase block, and for performing an additional erase operation based on an erase optimization;
an intervening command module coupled to the partial erase module for performing an intervening command on the target block based on the command status indicating an incomplete erase status, with the intervening command updating the command status;
an optimization module coupled to the intervening command module for performing the erase optimization based on the command status; and
an update module coupled to the optimization module for updating the command status to an erase complete status based on the additional erase operation;
wherein the configuration module, the partial erase module, the intervening command module, the optimization module and the update module include executable instructions executed by a control unit of the controller.

8. The system as claimed in claim 7 further comprising:
a check status module coupled to the partial erase module for calculating a memory age of the erase block based on age metrics; and
wherein:
the optimization module is for performing the erase optimization based on the memory age.

9. The system as claimed in claim 7 wherein:
the optimization module is for calculating erase operation values for the operation matrix; and
the partial erase module is for performing the additional erase operation with the erase operation values.

10. The system as claimed in claim 7 wherein:
the optimization module includes a dwell time module for calculating a dwell time for the erase block; and
the partial erase module is for implementing a dwell delay for the dwell time before the additional erase operation to increase endurance.

11. The system as claimed in claim 7 wherein the optimization module includes a total time module for implementing a total execution time less than a maximum execution time.

12. The system as claimed in claim 7 wherein the intervening command module is for performing more than one of the intervening command between the erase operation and another of the erase operation.

13. The system as claimed in claim 7 further comprising:
a check status module coupled to the partial erase module for calculating a memory age of the erase block; and
wherein:
the optimization module is for calculating erase operation values for the operation matrix, the erase operation values having an erase voltage and an erase pulse width, and for setting the erase voltage based on the memory age, the erase voltage having a higher value for larger values of the memory age; and
the partial erase module is for performing the additional erase operation with the erase voltage and the erase pulse width for partially erasing the erase block.

14. A data storage system comprising:
a controller coupled to a non-volatile memory array having an erase block and a target block, the target block in a logical unit separate from the erase block; the controller including:
a control unit coupled to the non-volatile memory array for performing an erase operation on the erase block, the erase operation having an operation matrix configured for partial erasing of the erase block, the erase operation updating a command status for the erase block, for performing an intervening command on the target block, based on the command status indicating an incomplete erase status, with the intervening command updating the command status, and for performing an additional erase operation based on an erase optimization;
a memory interface having circuitry for communicating with the non-volatile memory array; and
a database coupled to the control unit to store read threshold information; and
array logic for coupling the non-volatile memory array to the memory interface of the controller;
wherein the control unit, the memory interface, and the array logic comprise hardware logic.

15. The system as claimed in claim 14 wherein:
the control unit is for calculating a memory age of the erase block based on age metrics; and
the array logic is for performing the erase optimization based on the memory age.

16. The system as claimed in claim 14 wherein:
the database is for calculating erase operation values for the operation matrix; and
the control unit is for performing the additional erase operation with the erase operation values.

17. The system as claimed in claim 14 wherein the control unit is for calculating a dwell time for the erase block and for implementing a dwell delay for the dwell time before the additional erase operation to increase endurance.

18. The system as claimed in claim 14 wherein the array logic is for implementing a total execution time less than a maximum execution time.

19. The system as claimed in claim 14 wherein the memory interface is for performing more than one of the intervening command between the erase operation and another of the erase operation.

20. The system as claimed in claim 14 wherein the control unit is for calculating a memory age of the erase block, for calculating erase operation values for the operation matrix, the erase operation values having an erase voltage and an erase pulse width, for setting the erase voltage based on the memory age with the erase voltage having a higher value for larger values of the memory age, and for performing the additional erase operation with the erase voltage and the erase pulse width configured for partially erasing the erase block.

* * * * *

UNITED STATES PATENT AND TRADEMARK OFFICE
CERTIFICATE OF CORRECTION

PATENT NO. : 9,152,555 B2  
APPLICATION NO. : 14/082031  
DATED : October 6, 2015  
INVENTOR(S) : Higgins et al.

Page 1 of 1

It is certified that error appears in the above-identified patent and that said Letters Patent is hereby corrected as shown below:

In the claims, claim 7, column 19, line 38, please delete "block based" and insert --block, based--.

Signed and Sealed this  
Twenty-second Day of March, 2016

Michelle K. Lee  
*Director of the United States Patent and Trademark Office*